(12) United States Patent
Nishida

(10) Patent No.: US 12,513,901 B2
(45) Date of Patent: Dec. 30, 2025

(54) MEMORY DEVICE WITH PERIODICALLY VARYING MEMORY FILM THICKNESS

(71) Applicant: KIOXIA CORPORATION, Tokyo (JP)

(72) Inventor: Daisuke Nishida, Mie Mie (JP)

(73) Assignee: KIOXIA CORPORATION, Tokyo (JP)

(*) Notice: Subject to any disclaimer, the term of this patent is extended or adjusted under 35 U.S.C. 154(b) by 631 days.

(21) Appl. No.: 17/898,148

(22) Filed: Aug. 29, 2022

(65) Prior Publication Data

US 2023/0292506 A1 Sep. 14, 2023

(30) Foreign Application Priority Data

Mar. 8, 2022 (JP) .................... 2022-035592

(51) Int. Cl.
*H10B 43/27* (2023.01)
*H01L 23/528* (2006.01)
(Continued)

(52) U.S. Cl.
CPC ......... *H10B 43/27* (2023.02); *H01L 23/5283* (2013.01); *H10B 43/10* (2023.02); *H10B 43/35* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40;
(Continued)

(56) References Cited

U.S. PATENT DOCUMENTS 8,723,247 B2 5/2014 Komori et al.
8,796,757 B2 8/2014 Kai et al.
(Continued)

FOREIGN PATENT DOCUMENTS

CN 111149205 A 5/2020
JP 2010-161154 A 7/2010
(Continued)

*Primary Examiner* — William B Partridge
*Assistant Examiner* — Gustavo G Ramallo
(74) *Attorney, Agent, or Firm* — Foley & Lardner LLP

(57) ABSTRACT

According to one embodiment, a semiconductor memory device includes a stacked body including a plurality of electrode layers and a plurality of insulating layers, the electrode layers and the insulating layers being alternately stacked, and a memory film extending in a stacking direction in the stacked body. The memory film includes an oxide film facing the insulating layers, a block insulating film facing the electrode layers and the oxide film, and a charge storage film facing the block insulating film. The block insulating film has a larger thickness at a portion facing each of the insulating layers than at a portion facing each of the electrode layers, and the charge storage film has a smaller thickness at a portion facing each of the insulating layers than at a portion facing each of the electrode layers.

18 Claims, 16 Drawing Sheets

(51) Int. Cl.
  *H10B 43/10* (2023.01)
  *H10B 43/35* (2023.01)
(58) Field of Classification Search
  CPC ........ H10B 43/50; H10B 51/00; H10B 51/10;
            H10B 51/20; H10B 51/30; H10B 51/40;
            H10B 51/50
  See application file for complete search history.

(56) References Cited

U.S. PATENT DOCUMENTS

| | | | | |
|---|---|---|---|---|
| 8,847,304 | B1* | 9/2014 | Lee | H10D 30/69 |
| | | | | 257/357 |
| 9,524,984 | B1* | 12/2016 | Lee | H10B 43/27 |
| 10,147,732 | B1* | 12/2018 | Hu | H10B 41/35 |
| 10,504,917 | B2 | 12/2019 | Sandhu et al. | |
| 2013/0207178 | A1* | 8/2013 | Lee | H01L 21/32133 |
| | | | | 257/324 |
| 2016/0293623 | A1* | 10/2016 | Simsek-Ege | H10D 64/037 |
| 2017/0236827 | A1* | 8/2017 | Hirotani | H10B 43/27 |
| | | | | 257/326 |
| 2019/0051661 | A1 | 2/2019 | Carlson | |
| 2020/0411761 | A1 | 12/2020 | Gotti et al. | |
| 2021/0082940 | A1 | 3/2021 | Uchimura et al. | |
| 2021/0358949 | A1 | 11/2021 | Kim | |
| 2025/0254874 | A1* | 8/2025 | Han | H10B 41/27 |

FOREIGN PATENT DOCUMENTS

| | | |
|---|---|---|
| JP | 5431386 B2 | 3/2014 |
| JP | 5514004 B2 | 6/2014 |
| TW | I708375 B | 10/2020 |

\* cited by examiner

MEMORY DEVICE WITH PERIODICALLY VARYING MEMORY FILM THICKNESS

CROSS-REFERENCE TO RELATED APPLICATION(S)

This application is based upon and claims the benefit of priority from Japanese Patent Application No. 2022-035592, filed Mar. 8, 2022, the entire contents of which are incorporated herein by reference.

FIELD

Embodiments described herein relate generally to a semiconductor memory device and a method for manufacturing the same.

BACKGROUND

Semiconductor memory devices include a semiconductor memory device including a three-dimensional memory cell array. Such a semiconductor memory device includes a stacked body in which a plurality of electrode layers functioning as word lines are stacked and a memory film is formed.

In recent years, the semiconductor memory device has a decreased distance between the electrode layers due to an increase in the capacity of a memory. The decreased distance between the electrode layers easily causes charge movement between memory cells (so-called charge de-trapping). Thus, the charge retention property of the memory cells may be deteriorated.

DETAILED DESCRIPTION

Embodiments provide a semiconductor memory device capable of improving charge retention property and a method for manufacturing the same.

In general, according to one embodiment, a semiconductor memory device includes a stacked body including a plurality of electrode layers and a plurality of insulating layers, the electrode layers and the insulating layers being alternately stacked, and a memory film extending in a stacking direction in the stacked body. The memory film includes an oxide film facing the insulating layers, a block insulating film facing the electrode layers and the oxide film, and a charge storage film facing the block insulating film. The block insulating film has a larger thickness at a portion facing each of the insulating layers than at a portion facing each of the electrode layers, and the charge storage film has a smaller thickness at a portion facing each of the insulating layers than at a portion facing each of the electrode layers.

Hereinafter, embodiments will be described with reference to the drawings. The present disclosure is not limited to the embodiments. The following embodiments describe a semiconductor memory device including a three-dimensional memory cell array. This semiconductor memory device is a NAND-type nonvolatile semiconductor memory device in which data can be electrically and freely erased and written and that can retain a stored content when a power is turned off.

First Embodiment

Figure 1:
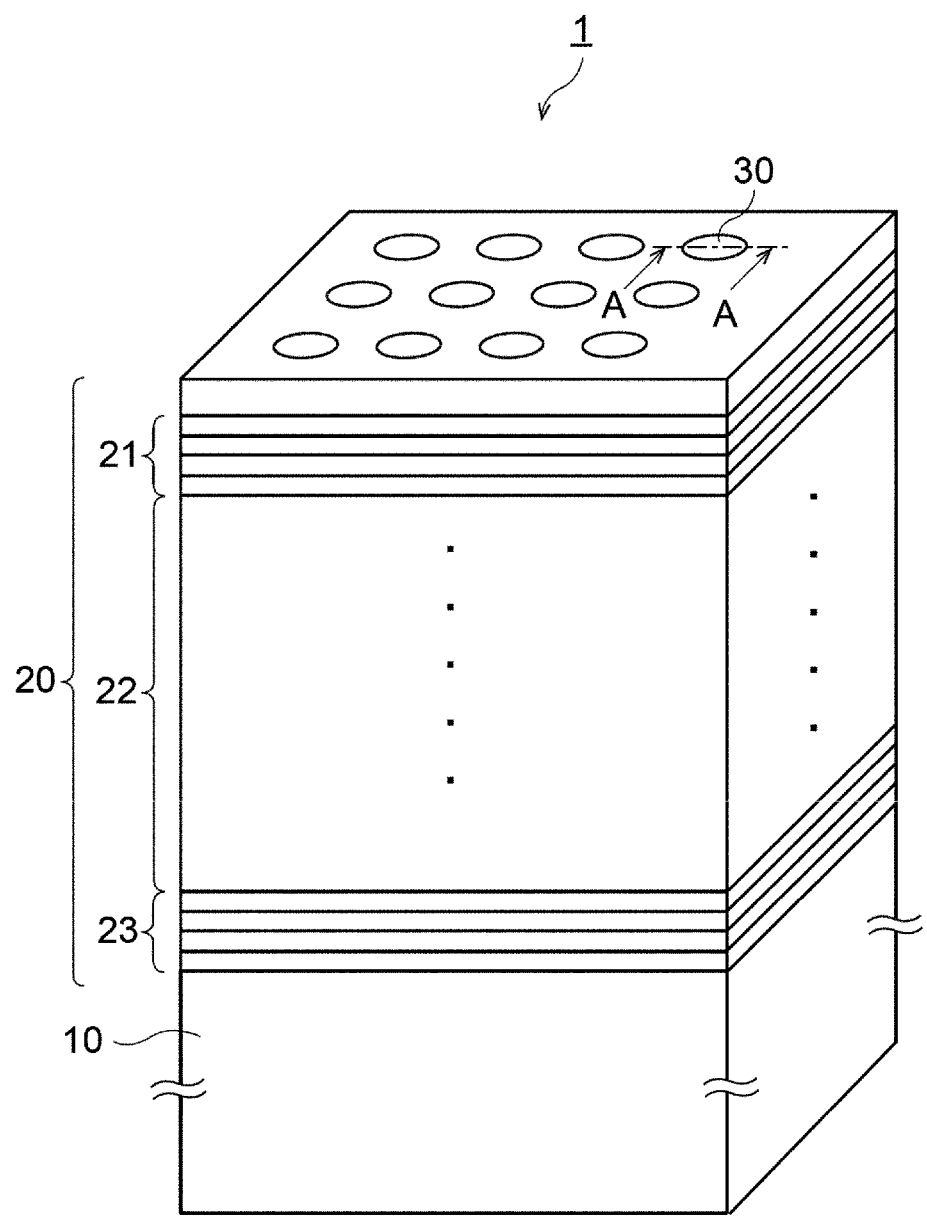
FIG. 1 is a perspective view illustrating the structure of a main part of a semiconductor memory device according to a first embodiment.

FIG. 1 is a perspective view illustrating the structure of a main part of a semiconductor memory device according to a first embodiment. A semiconductor memory device 1 in FIG. 1 includes a substrate 10, a stacked body 20, and a plurality of memory films 30. In the following description, X and Y directions are two directions that are parallel to the substrate 10 and are orthogonal to each other. A Z direction is a direction perpendicular to the substrate 10 and is orthogonal to the X and Y directions. The Z direction is also a stacking direction of the stacked body 20.

The substrate 10 is, for example, a silicon substrate. The stacked body 20 is provided on the substrate 10. Between the substrate 10 and the stacked body 20, a circuit layer having a drive element used in driving the memory films 30, such as a transistor, and a wiring layer having a wire used in driving the memory films 30 may be formed.

The stacked body 20 includes a select gate drain (SGD) 21, a cell 22, and a select gate source (SGS) 23. The SGD 21 is disposed at a top layer of the stacked body 20 and has a plurality of drain-side select gate electrodes. The SGS 23 is disposed at a bottom layer of the stacked body 20 and has a plurality of source-side select gate electrodes. The cell 22 is disposed between the SGD 21 and the SGS 23 and has a plurality of word lines.

The memory films 30 are disposed in a zigzag pattern in the X and Y directions. The memory films 30 extend in the Z direction in the stacked body 20.

Figure 2:
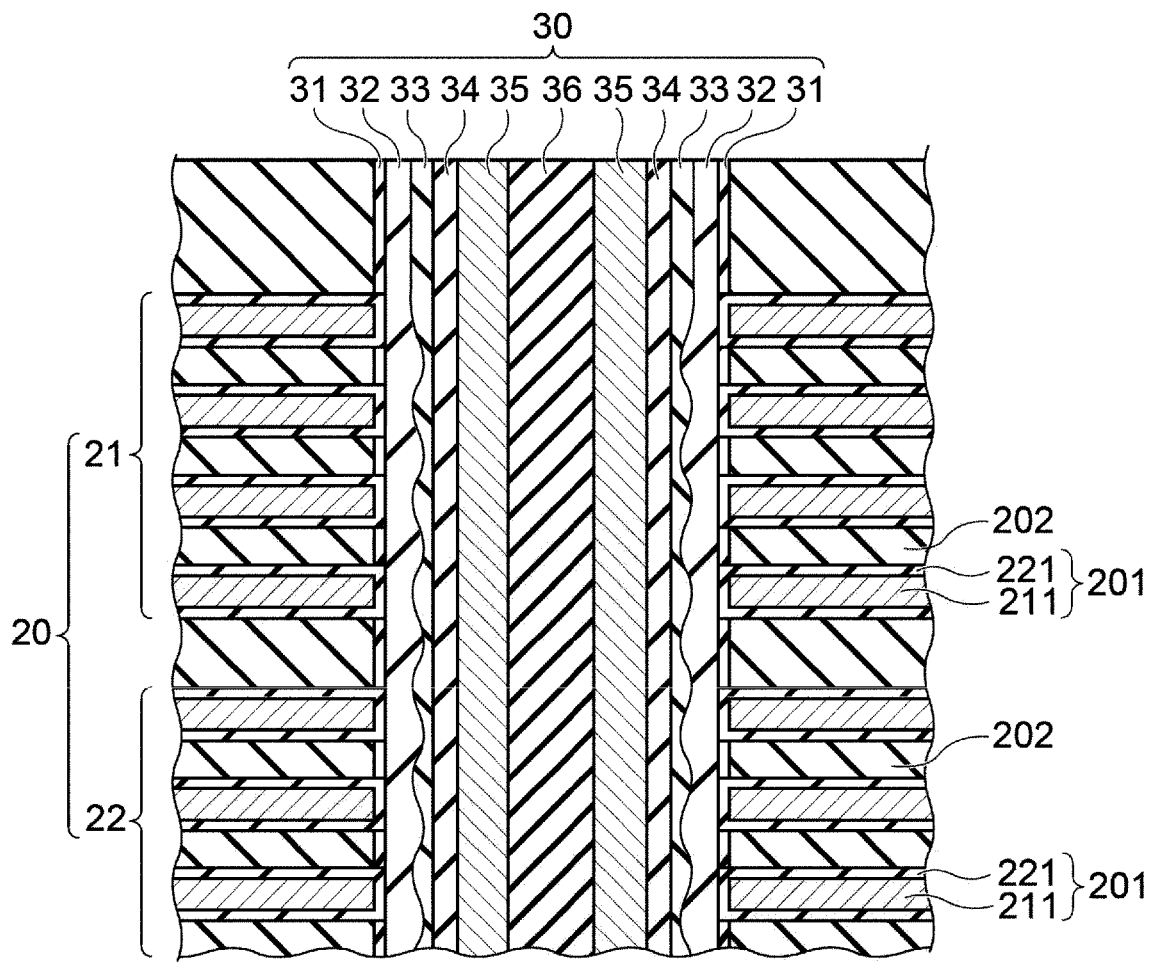
FIG. 2 is a view of a part of a cross-section taken along a section line A-A in FIG. 1.

FIG. 2 is a view of a part of a cross-section taken along a section line A-A in FIG. 1. Here, the structure of the stacked body 20 will be described with reference to FIG. 2.

The structure of the stacked body 20 will first be described. As shown in FIG. 2, a plurality of plate-shaped electrode layers 201 and a plurality of plate-shaped insulating layers 202 are alternately stacked in the Z direction in the stacked body 20. The electrode layers 201 each include a conductive layer 211 and a block insulating layer 221 that covers the conductive layer 211. The conductive layer 211 contains, for example, a metal such as tungsten (W). The block insulating layer 221 contains, for example, aluminum oxide ($Al_2O_3$). The insulating layers 202 contain, for example, silicon oxide ($SiO_2$).

Among the electrode layers 201, the electrode layers 201 formed in the SGD 21 are the drain-side select gate electrodes described above. The electrode layers 201 formed in the cell 22 are the word lines described above. The electrode layers 201 formed in the SGS 23, which are not shown in FIG. 2, are the source-side select gate electrodes described above.

Figure 3:
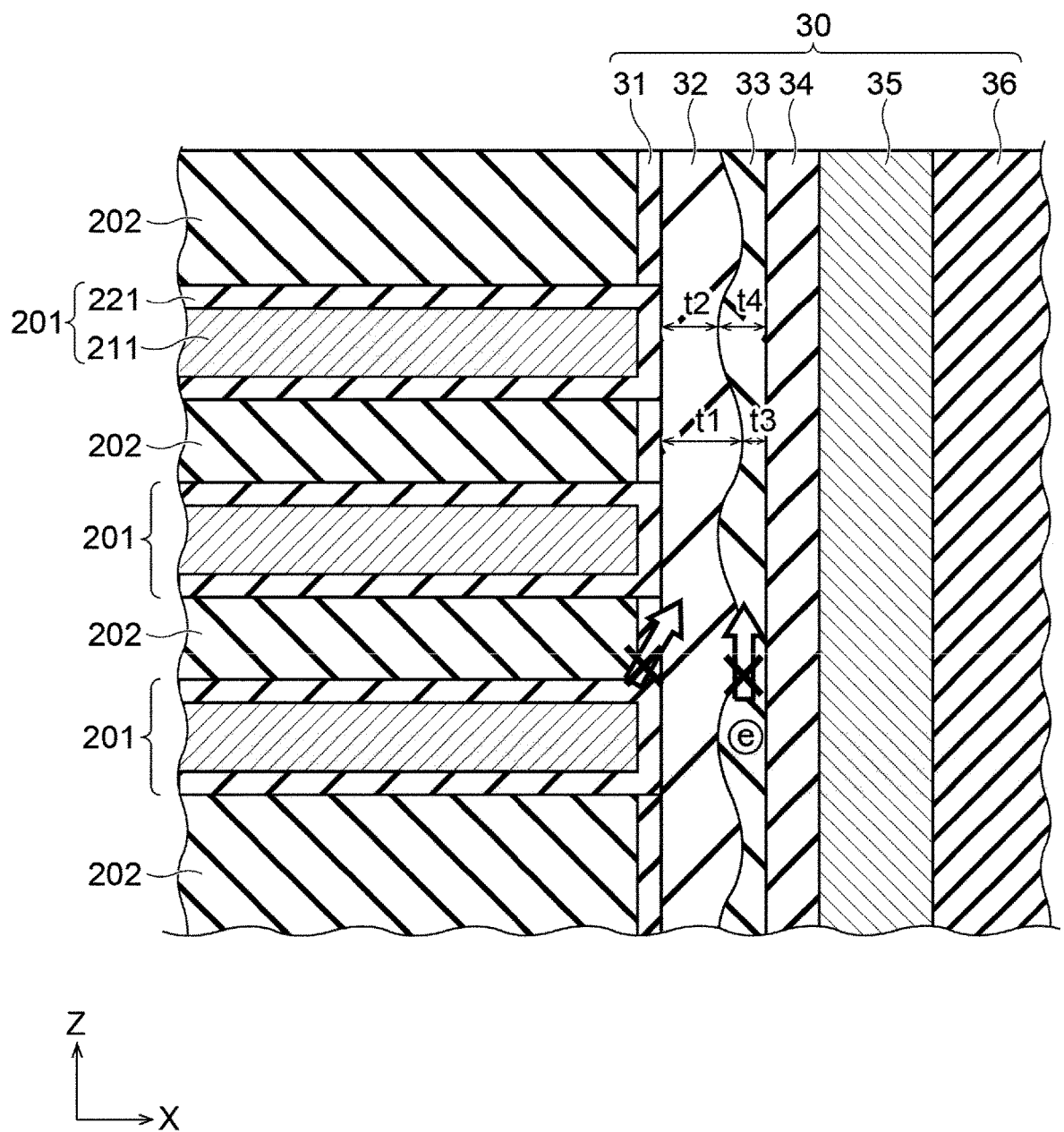
FIG. 3 is an enlarged cross-sectional view of a part of a cell.

FIG. 3 is an enlarged cross-sectional view of a part of the cell 22. Here, the structure of the memory films 30 will be described with reference to FIG. 3. Each of the memory films 30 shown in FIG. 3 includes an oxide film 31, a block insulating film 32, a charge storage film 33, a tunnel insulating film 34, a channel film 35, and a core insulating film 36 that are stacked in this order.

The oxide film 31 is stacked in the X direction on each of the insulating layers 202. The oxide film 31 is formed from a high-k material (high dielectric constant insulating material). The oxide film 31 functions as an enhanced oxidation film that promotes oxidation. The high-k material contained in the oxide film 31 is, for example, hafnium oxide ($HfO_2$), aluminum oxide ($Al_2O_3$), titanium oxide ($TiO_2$), barium oxide (BaO), ruthenium oxide ($RuO_4$), lanthanum oxide ($La_2O_3$), zirconium oxide ($ZrO_2$), yttrium oxide ($Y_2O_3$), magnesium oxide (MgO), tantalum oxide ($Ta_2O_5$), strontium oxide (SrO), or niobium oxide ($Nb_2O_5$). The high-k material may be an oxynitride such as aluminum oxynitride (AlON), hafnium oxynitride (HfON), titanium oxynitride (TiON), or zirconium oxynitride (ZrON). The high-k material may be a mixture of metal oxides having different valences obtained, for example, by adding aluminum, iodine, or lanthanum to a metal oxide such as titanium oxide, hafnium oxide, or zirconium oxide or adding titanium, hafnium, or zirconium to a metal oxide such as tantalum oxide or niobium oxide.

The block insulating film 32 is stacked in the X direction on the oxide film 31 and the electrode layers 201. The block insulating film 32 contains, for example, silicon oxide. The block insulating film 32 is affected by enhanced oxidation caused by the oxide film 31. Therefore, a thickness t1 of the block insulating film 32 at a portion facing each of the insulating layers 202 is larger than a thickness t2 thereof at a portion facing each of the electrode layers 201. Therefore, the thickness of the block insulating film 32 varies periodically in the stacking direction (Z direction) of the electrode layers 201 and the insulating layers 202. Specifically, the block insulating film 32 includes a protrusion that protrudes in the X direction and a recess that concaves in the X direction, and the protrusion and the recess are alternately formed in the stacking direction.

The charge storage film 33 is stacked in the X direction on the block insulating film 32. The charge storage film 33 contains, for example, silicon nitride (SiN). A thickness t3 of the charge storage film 33 at a portion facing each of the insulating layers 202 is smaller than a thickness t4 thereof at a portion facing each of the electrode layers 201. A periodic change in the thickness of the block insulating film 32 in the stacking direction is opposite to a periodic changed in the thickness of the charge storage film 33 in the stacking direction. Specifically, a recess of the charge storage film 33 faces the protrusion of the block insulating film 32, and a protrusion of the charge storage film 33 faces the recess of the block insulating film 32. As the cross-section of the stacked body 20 in the stacking direction is viewed as shown in FIG. 3, a border line between the block insulating film 32 and the charge storage film 33 is a rounded curve, but not a rectangle.

The tunnel insulating film 34 is stacked in the X direction on the charge storage film 33. The tunnel insulating film 34 contains, for example, silicon oxide. The channel film 35 is stacked in the X direction on the tunnel insulating film 34.

The channel film 35 is stacked in the X direction on the tunnel insulating film 34. The channel film 35 is formed from, for example, a polysilicon. A channel film may be formed in the SGS 23 by epitaxial growth of silicon contained in the substrate 10 although this is not shown in FIG. 3.

The core insulating film 36 is stacked in the X direction on the channel film 35. The core insulating film 36 contains, for example, silicon oxide.

In the semiconductor memory device 1 configured as describe above, an intersection point between each of the memory films 30 and each of the electrode layers 201 is a surrounding gate transistor. An intersection point between each of the electrode layers 201 (drain-side select gate electrodes) in the SGD 21 and each of the memory films 30 is a drain-side select transistor among the surrounding gate transistors. An intersection point between each of the electrode layers 201 (source-side select gate electrodes) in the SGS 23 and each of the memory films 30 is a source-side select transistor. Furthermore, an intersection point between each of the electrode layers 201 (word lines) in the cell 22 and each of the memory films 30 is a memory cell. The drain-side select transistor, the memory cell, and the source-side select transistor are connected to one another in series.

Figure 4:
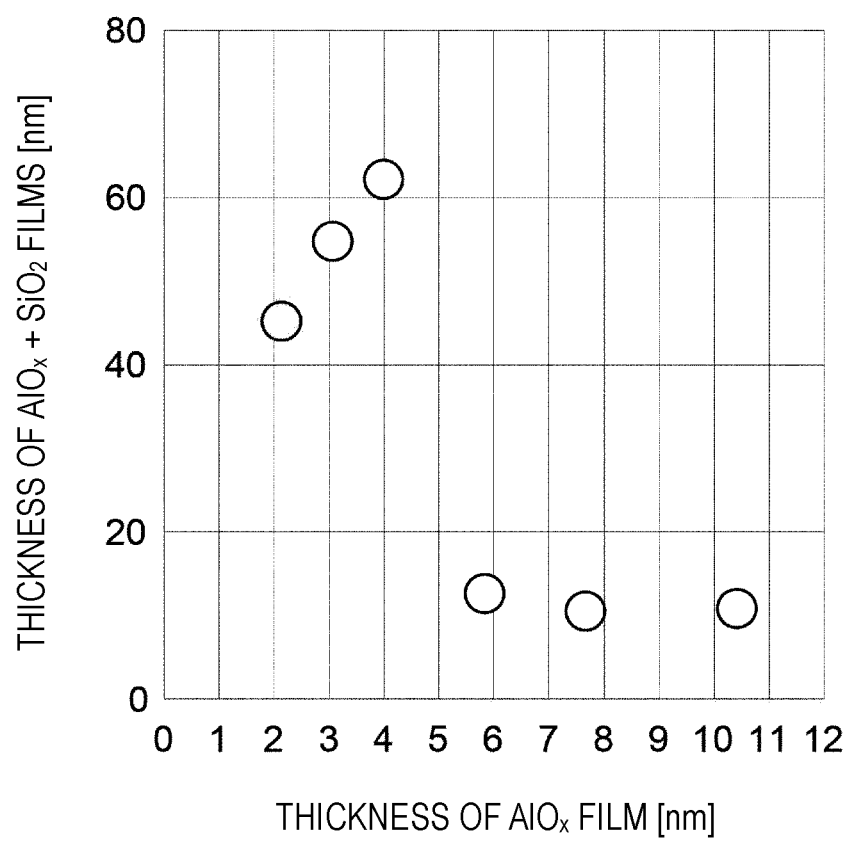
FIG. 4 is a graph showing an example of experimental results of enhanced oxidation caused by an oxide film.

Here, a suitable range of thickness of the oxide film 31 will be described with reference to FIG. 4. FIG. 4 is a graph showing an example of experimental results of enhanced oxidation caused by the oxide film 31. In this experiment, a specimen is used in which a silicon oxide ($SiO_2$) film is formed on a silicon substrate and an alumina ($AlO_x$) film is formed on the silicon oxide film. The silicon oxide film and the alumina film in the specimen correspond to the block insulating film 32 and the oxide film 31, respectively, in the semiconductor memory device 1 according to the embodiment. In this experiment, the sum of the thickness of the alumina film and the thickness of the silicon oxide film when the thickness of the alumina film is changed is determined with an electron microscope and the like.

In FIG. 4, the horizontal axis shows the thickness of the alumina film, the vertical axis shows the sum of the thickness of the alumina film and the thickness of the silicon oxide film. The experimental results shown in FIG. 4 indicate that the sum of the thicknesses increases within the range of the thickness of the alumina film of 2 nm or more and 4 nm or less. This shows occurrence of an effect of enhanced oxidation caused by the alumina film.

On the other hand, the sum of the thicknesses hardly changes when the thickness of the alumina film is more than 5 nm. This shows the loss of the effect of enhanced oxidation caused by the alumina film. Therefore, the thickness of the oxide film 31 corresponding to the alumina film is desirably 4 nm or less.

Hereinafter, a process of manufacturing the semiconductor memory device according to the embodiment will be described with reference to FIGS. 5 to 10.

Figure 5:
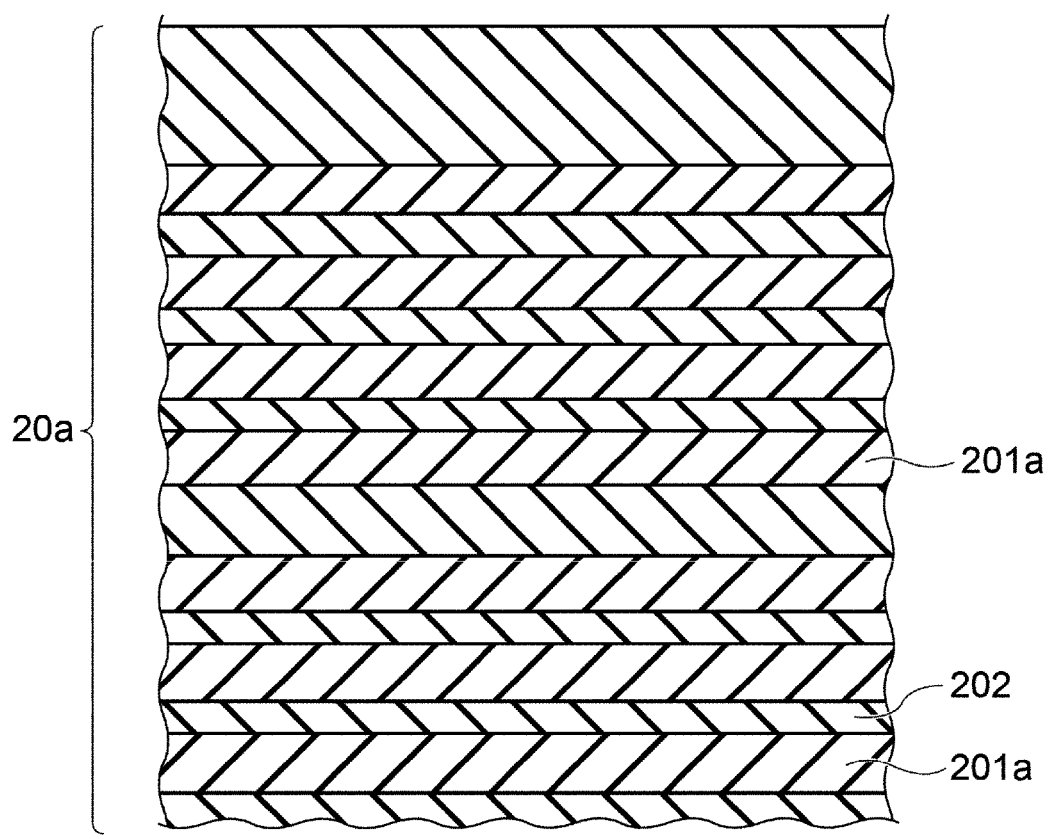
FIG. 5 is a cross-sectional view illustrating a step of forming a stacked body on a substrate.

As shown in FIG. 5, a stacked body 20a is formed on the substrate 10. A plurality of plate-shaped insulating layers 201a (first insulating layers) and a plurality of plate-shaped insulating layers 202 (second insulating layers) are alternately stacked in the Z direction in the stacked body 20a. The insulating layers 201a contain, for example, silicon nitride. The stacked body 20a may be formed, for example, by chemical vapor deposition (CVD) or atomic layer deposition (ALD).

Figure 6:
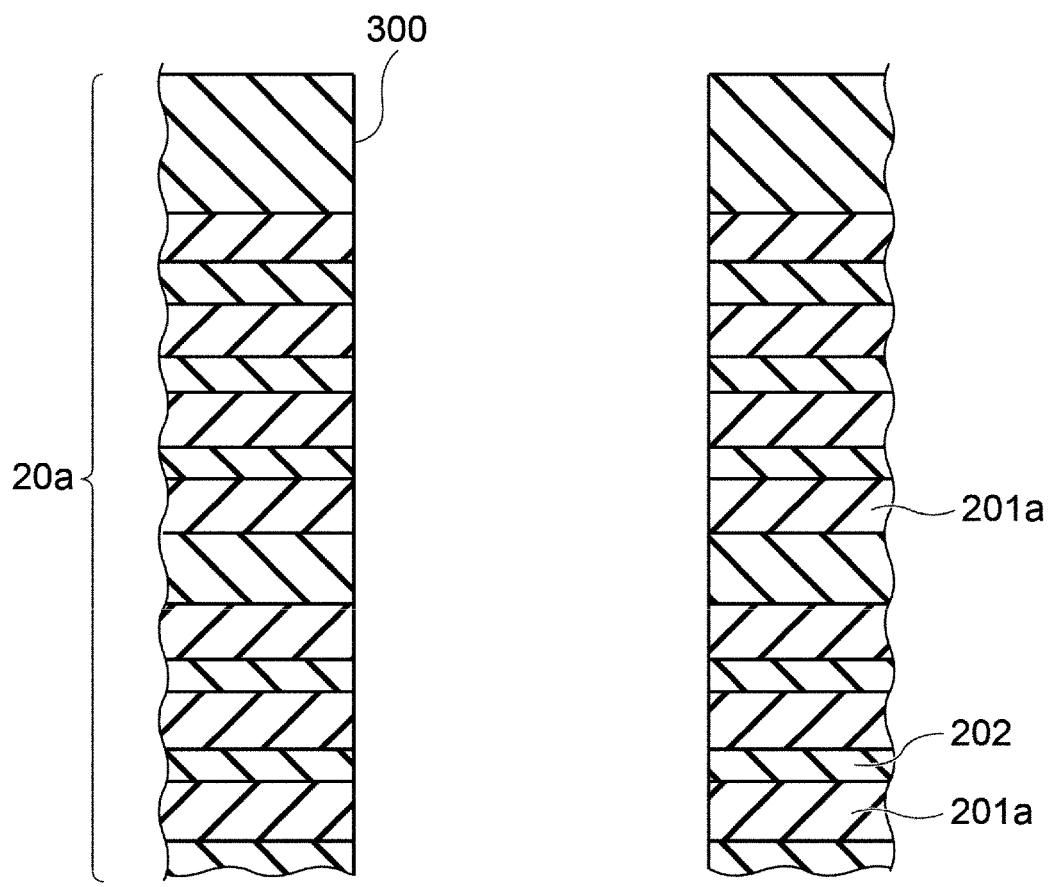
FIG. 6 is a cross-sectional view illustrating a step of forming a memory hole.

Subsequently, a memory hole 300 is formed so as to penetrate the stacked body 20a in the Z direction, as shown in FIG. 6. The formed memory hole 300 is at a location of each of the memory films 30 described above. The memory hole 300 may be formed, for example, by reactive ion etching (RIE).

Figure 7:
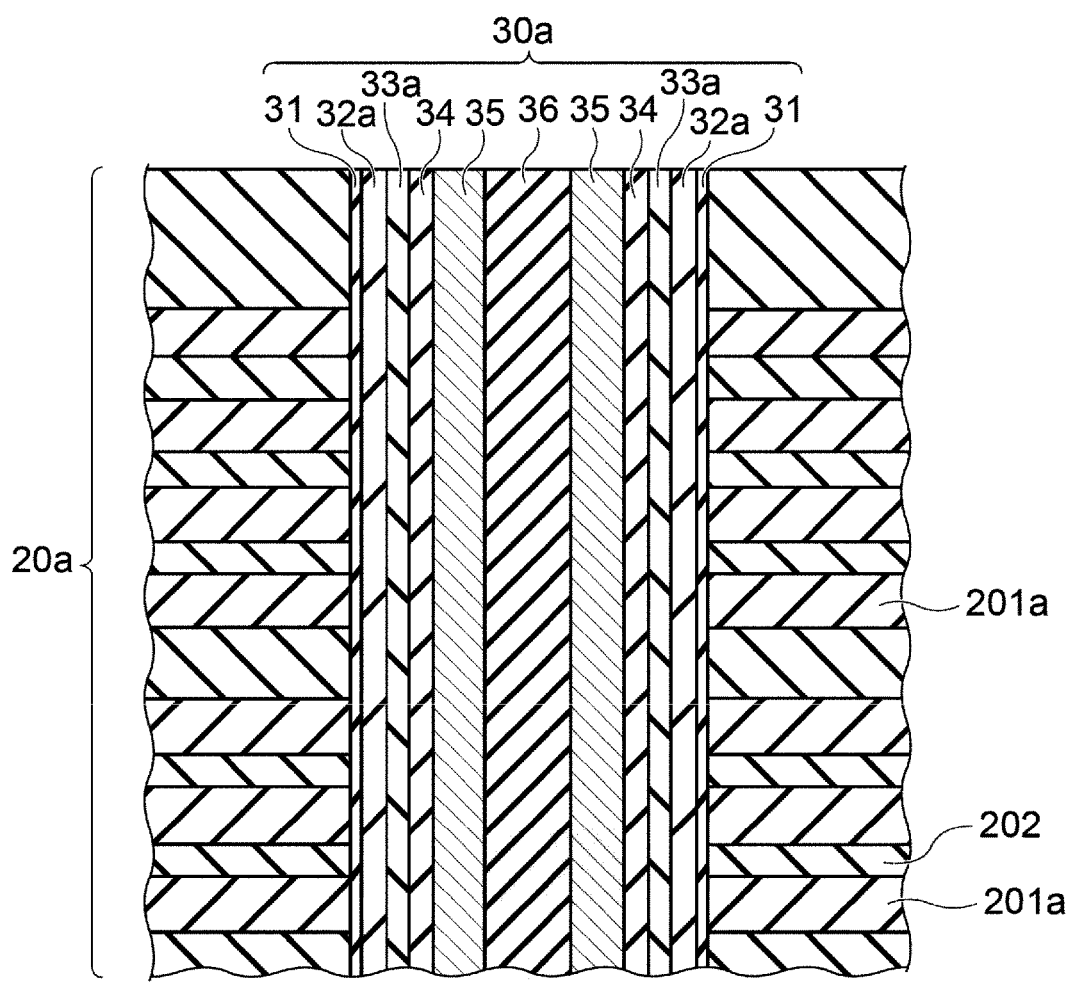
FIG. 7 is a cross-sectional view illustrating a step of forming a memory film according to the first embodiment.

As shown in FIG. 7, a memory film 30a is then formed in the memory hole 300. Specifically, the oxide film 31, a block insulating film 32a, a charge storage film 33a, the tunnel insulating film 34, the channel film 35, and the core insulating film 36 are formed continuously in this order. The oxide film 31 in the memory film 30a is an aluminum oxide film. This aluminum oxide film is formed not only on the insulating layers 202 but also on the insulating layers 201a as initial films. At that time, enhanced oxidation caused by the oxide film 31 does not occur, and thus the thicknesses of the block insulating film 32a and the charge storage film 33a are uniform in the Z direction.

Figure 8:
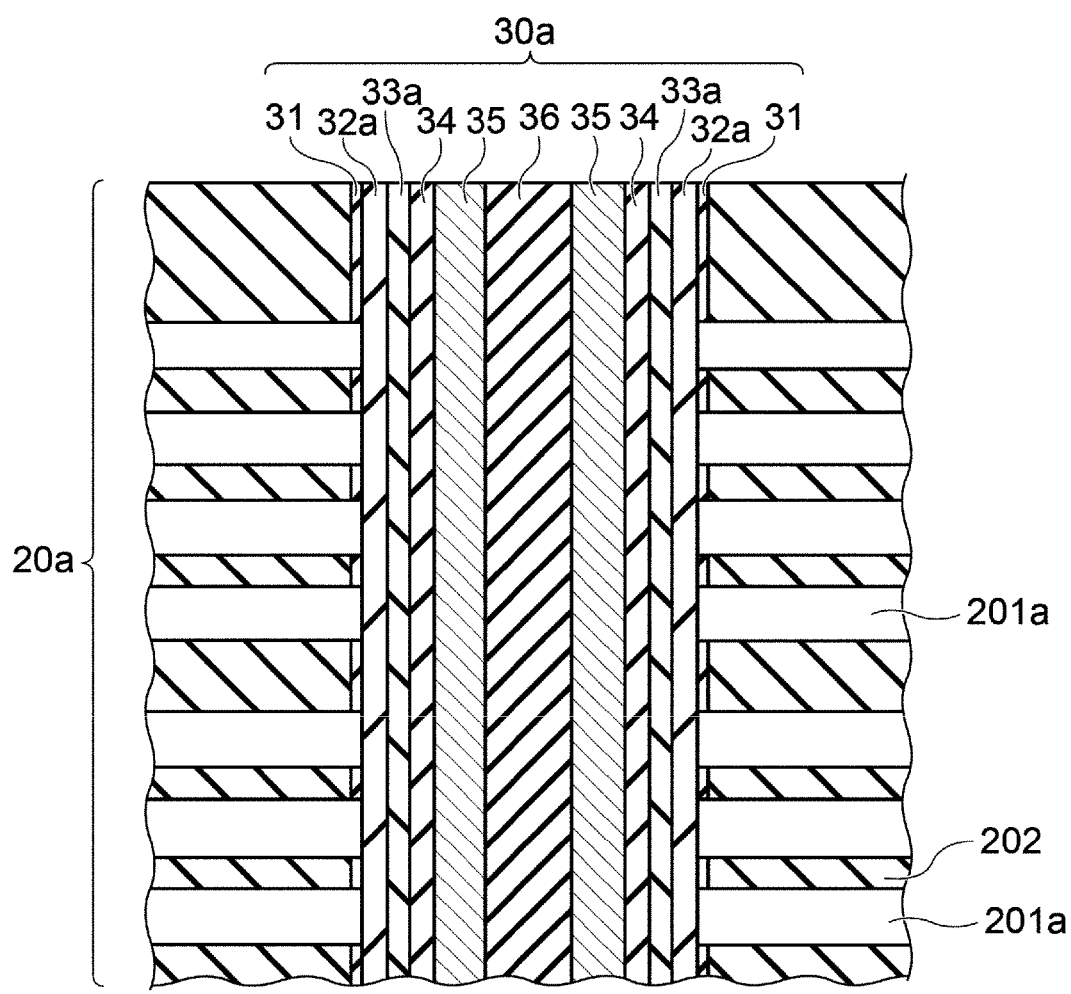
FIG. 8 is a cross-sectional view illustrating a step of removing an insulating layer according to the first embodiment.

Next, the insulating layers 201a are removed as shown in FIG. 8. The insulating layers 201a may be removed, for example, by wet etching using a chemical solution such as phosphoric acid. The oxide film 31 that is formed on each of the insulating layers 201a is also removed. Such an oxide film 31 may be removed, for example, by chemical dry etching (CDE).

Figure 9:
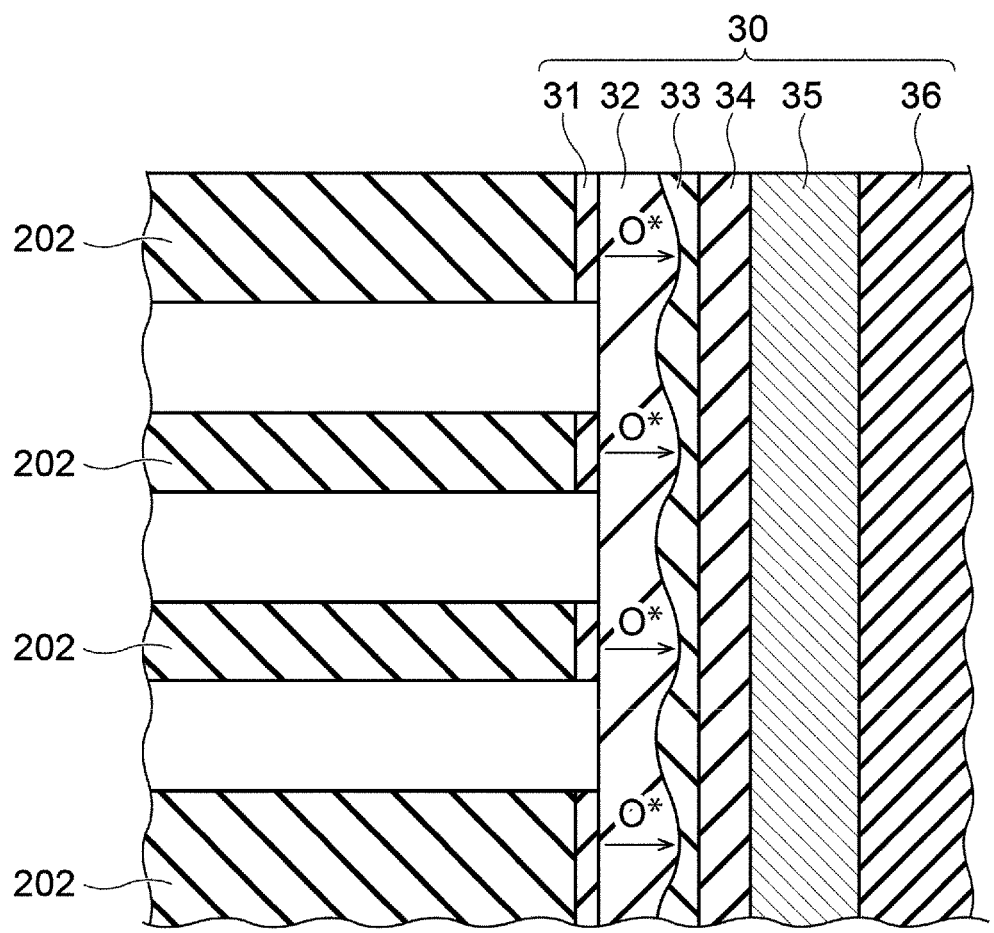
FIG. 9 is a cross-sectional view illustrating a step of performing an oxidation treatment according to the first embodiment.

Subsequently, an oxidation treatment is performed. In this oxidation treatment, for example, a water vapor generator (WVG) for combusting oxygen and hydrogen to generate water vapor ($H_2O$) is used. By the oxidation treatment, radicals (O*) are generated in the oxide film 31 stacked in the insulating layers 202 as shown in FIG. 9. The radicals promote oxidation of the block insulating film 32 at a portion facing the oxide film 31, to increase the thickness of the portion. As a result, the thickness of the charge storage film 33 at a portion facing the oxide film 31 decreases.

Figure 10:
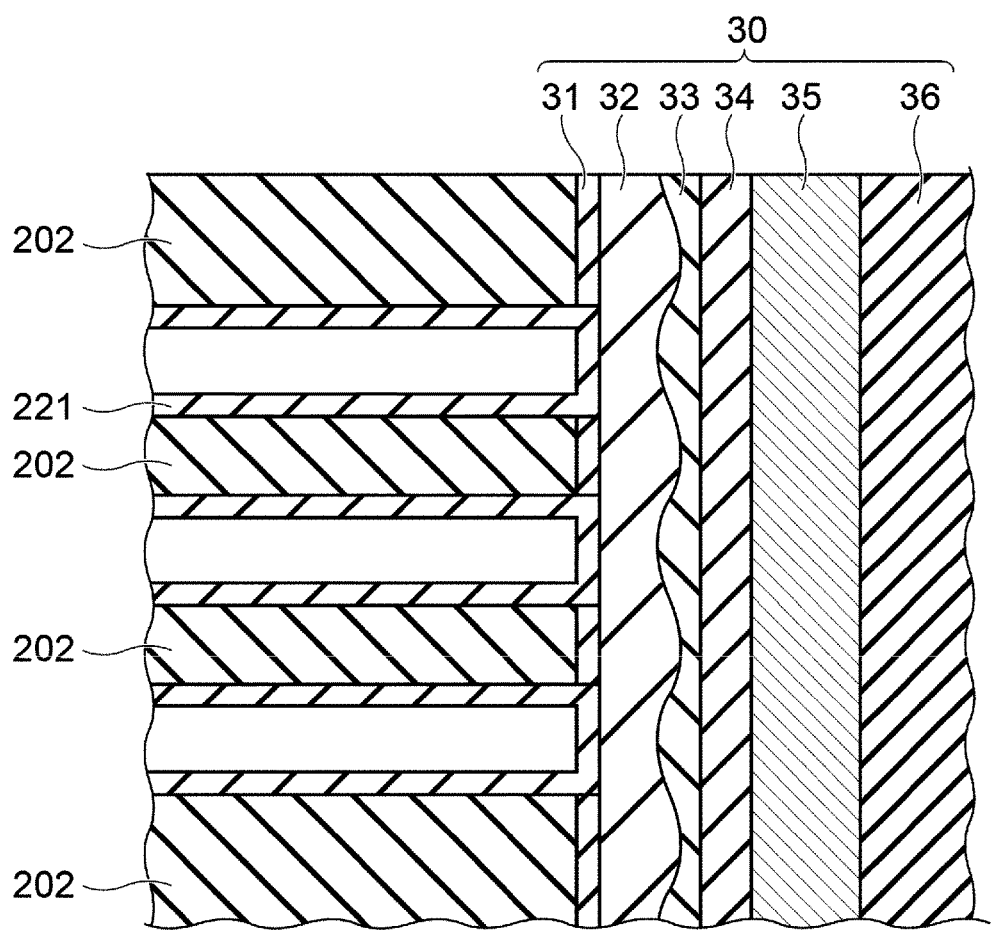
FIG. 10 is a cross-sectional view illustrating a step of forming a block insulating layer.

Next, the block insulating layer 221 is formed on a surface of each of the insulating layers 202 as shown in FIG. 10. Here, the same aluminum oxide film as the oxide film 31 is formed as the block insulating layer 221.

The conductive layer 211 is finally formed on a surface of the block insulating layer 221 as shown in FIG. 3. As a result, the insulating layers 201a are replaced by the electrode layers 201.

Figure 11:
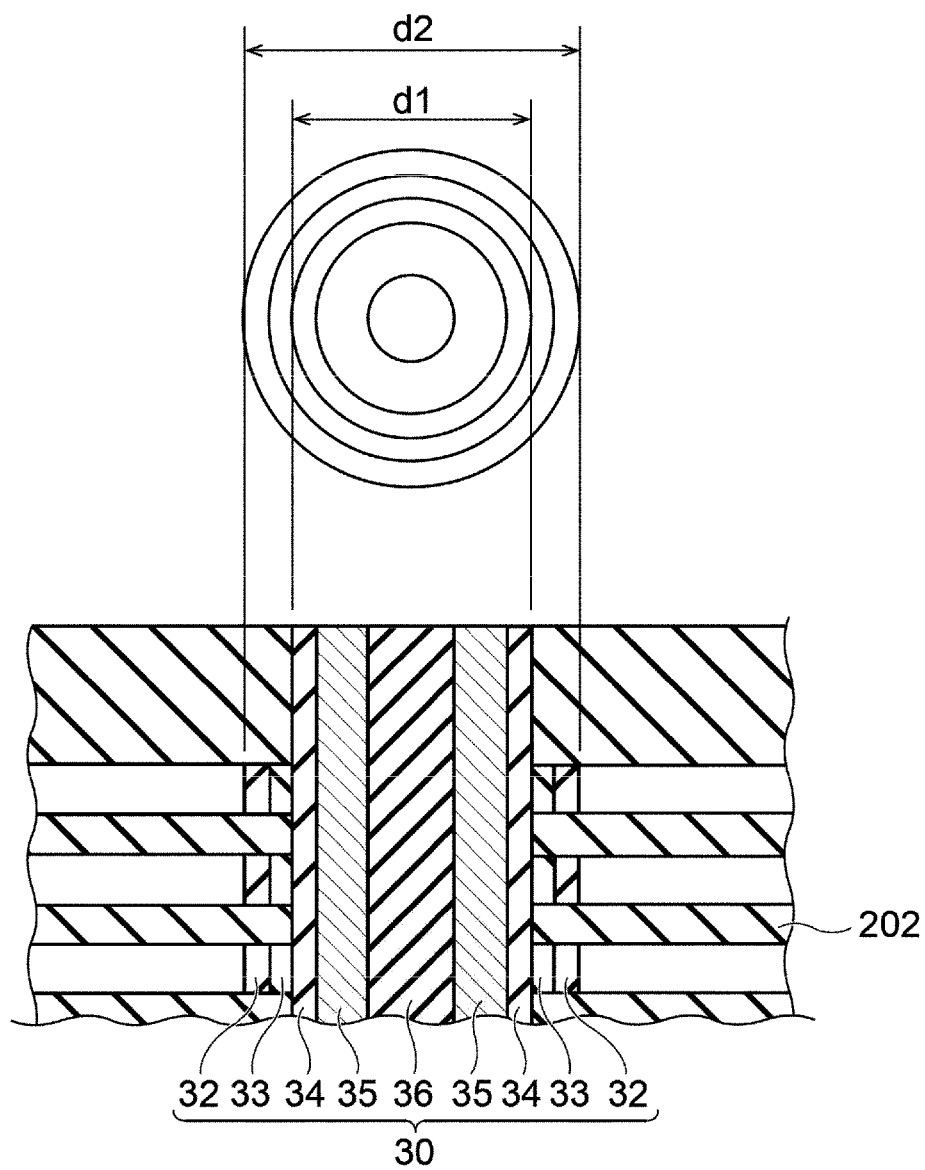
FIG. 11 is a plan view and a cross-sectional view illustrating a part of a process of manufacturing a semiconductor memory device according to a first comparative example.
Figure 12:
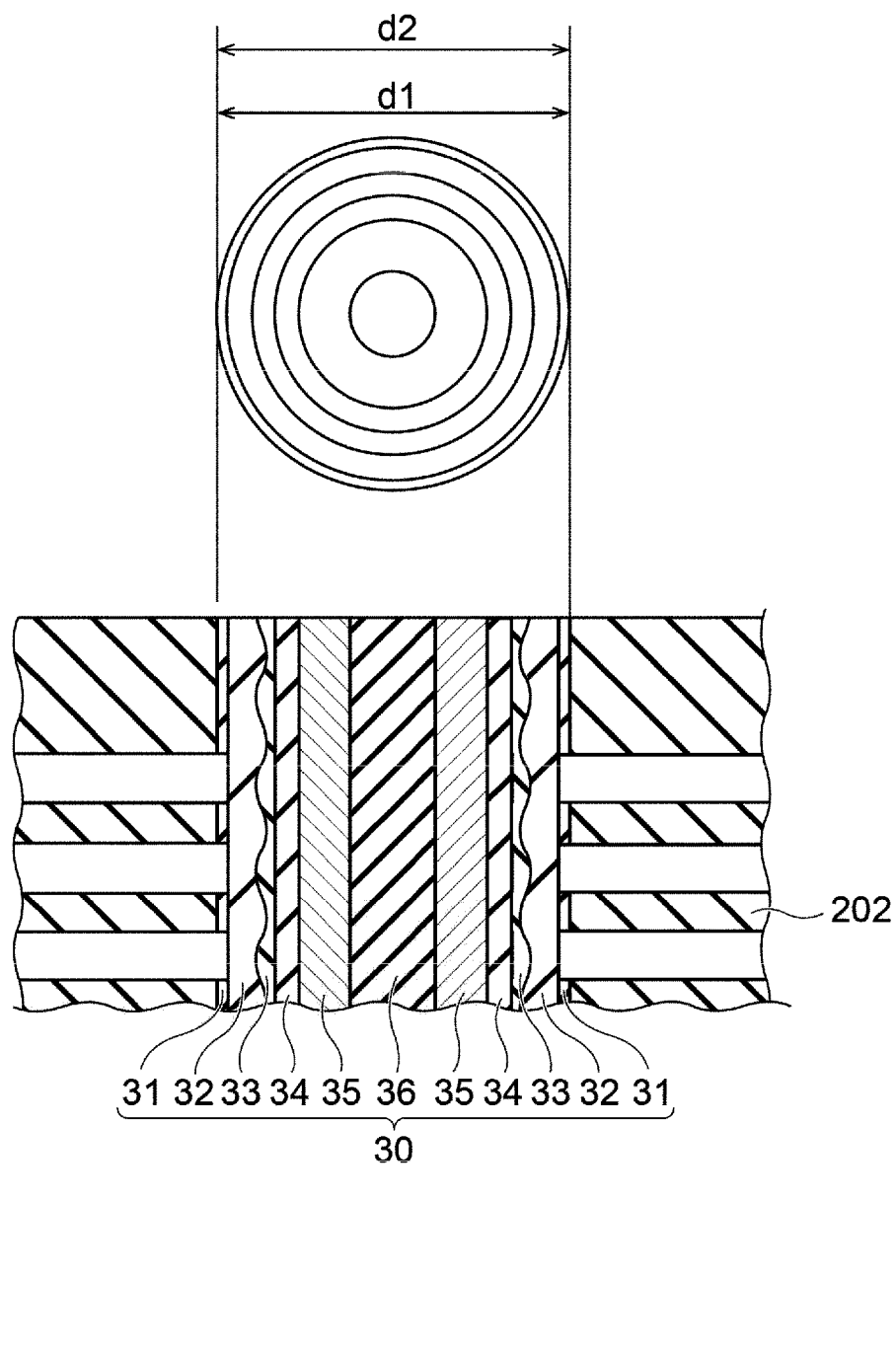
FIG. 12 is a plan view and a cross-sectional view illustrating a part of a process of manufacturing the semiconductor memory device according to the first embodiment.

Here, a method for manufacturing the semiconductor memory device 1 according to the embodiment described above is compared with a method for manufacturing a semiconductor memory device according to a first comparative example with reference to FIGS. 11 and 12.

FIG. 11 is a plan view and a cross-sectional view illustrating a part of a process of manufacturing the semiconductor memory device according to the first comparative example. The oxide film 31 is not formed in the semiconductor memory device shown in FIG. 11. The block insulating film 32 and the charge storage film 33 are formed at a portion where each of the insulating layers 201a is removed, but not in the memory hole 300. Therefore, a processing diameter d1 of the memory hole 300 needs to be smaller than a diameter d2 of the memory film 30. In a three-dimensional semiconductor memory device, as the number of the stacked electrode layers 201 is increased with an increase in memory capacity, the depth of the memory hole 300 is larger. Therefore, a small processing diameter d1 may make it difficult to stably form the memory hole 300.

FIG. 12 is a plan view and a cross-sectional view illustrating a part of a process of manufacturing the semiconductor memory device 1 according to the first embodiment. In this embodiment, the oxide film 31, the block insulating film 32, and the charge storage film 33 are formed in the memory hole 300. Therefore, the processing diameter d1 of the memory hole 300 is the same as the diameter d2 of the memory film 30. In this embodiment, the processing diameter d1 of the memory hole 300 can be made relatively larger. Accordingly, the memory hole 300 can be stably processed even when the number of the stacked electrode layers 201 is increased.

Figure 13:
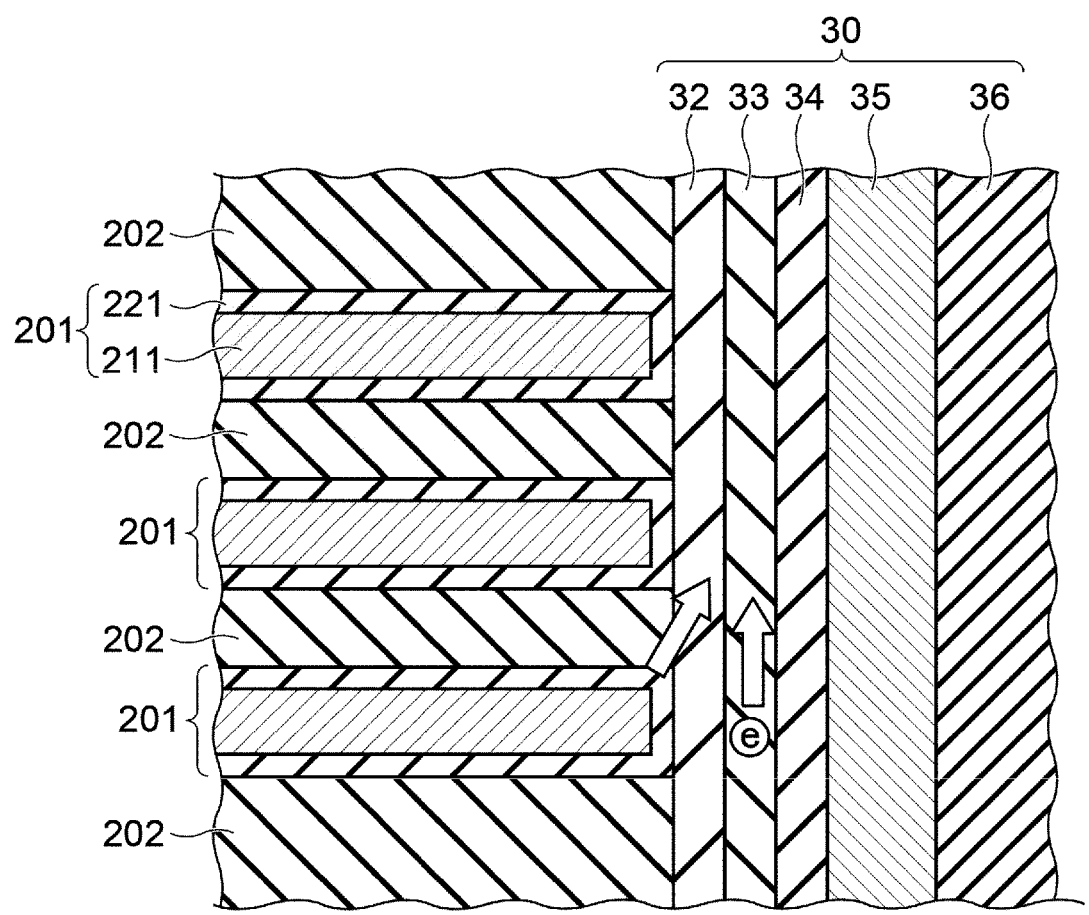
FIG. 13 is a cross-sectional view of a semiconductor memory device according to a second comparative example.

Here, the semiconductor memory device 1 according to the embodiment is compared with a semiconductor memory device according to a second comparative example with reference to FIGS. 3 and 13.

FIG. 13 is a cross-sectional view of the semiconductor memory device according to the second comparative example. This semiconductor memory device includes no oxide film 31 functioning as an enhanced oxidation film. Therefore, the thickness of the block insulating film 32 is uniform in the Z direction. When the distance between the electrode layers 201 is decreased by a decrease in the thickness of the insulating layers 202 due to miniaturization of a device, a charge may move between memory cells adjacent to each other in the Z direction, as shown in FIG. 13. The charge movement may cause a data write operation failure and a data erase operation failure.

As shown in FIG. 3, the semiconductor memory device 1 according to the embodiment includes the oxide film 31 functioning as an enhanced oxidation film between the insulating layers 202 and the block insulating film 32. Therefore, the portion facing each of the insulating layers 202 is thicker than the portion facing each of the electrode layers 201 in the block insulating film 32.

According to the embodiment, even when the distance between the electrode layers 201 is decreased due to a decrease in the thickness of the insulating layers 202, the charge movement between the memory cells adjacent to each other in the Z direction can be reduced. Therefore, the charge retention property can be improved.

Second Embodiment

Hereinafter, a semiconductor memory device according to a second embodiment will be described. The second embodiment is different from the first embodiment in terms of a method for producing the memory films 30. Therefore, a process of producing a memory film according to the embodiment will be described with reference to FIGS. 14 to 16. Components similar to those in the first embodiment are denoted by the same reference numerals, and detailed descriptions thereof will be omitted.

In the embodiment, steps of forming the stacked body 20a in which the insulating layers 201a and 202 are alternately stacked, and forming the memory hole 300 in the stacked body 20a are the same as those in the first embodiment.

Figure 14:
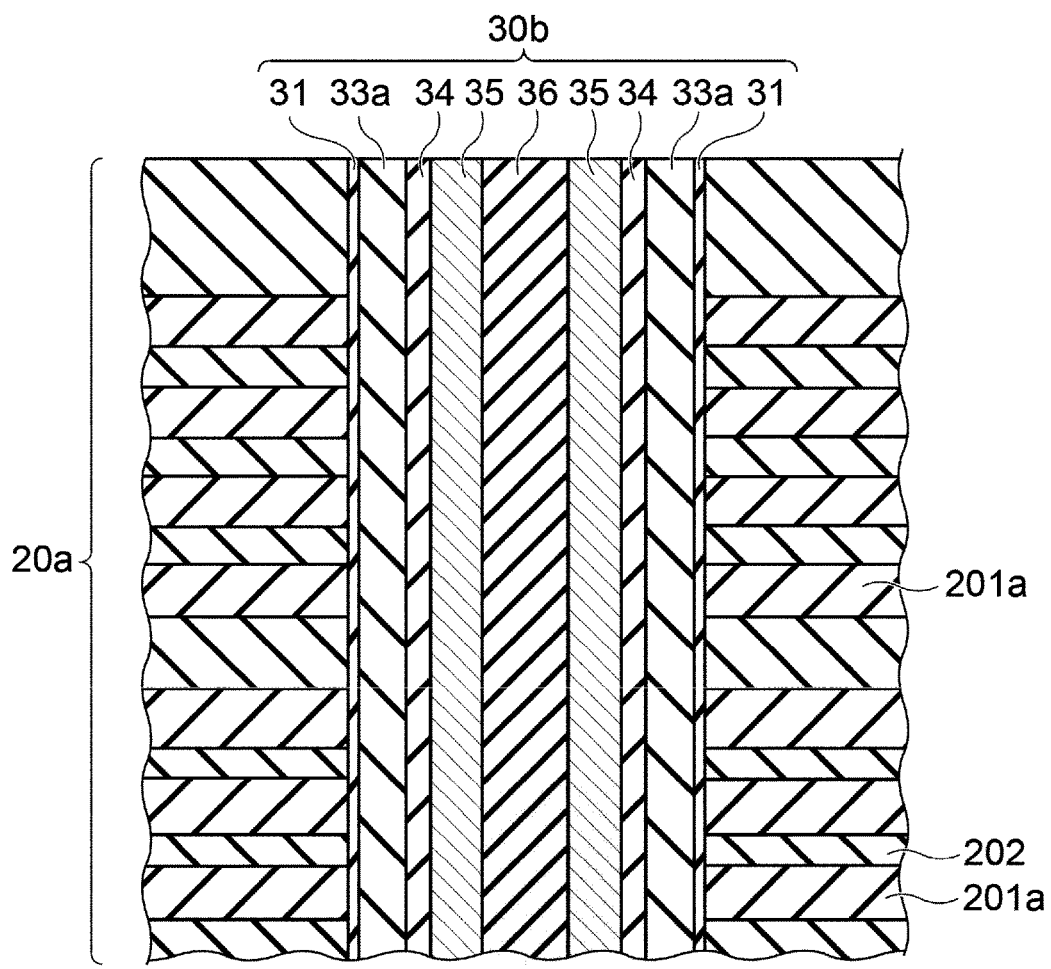
FIG. 14 is a cross-sectional view illustrating a step of forming a memory film according to a second embodiment.

As shown in FIG. 14, a memory film 30b is then formed in the memory hole 300. In a case of the memory film 30a according to the first embodiment, the oxide film 31, the block insulating film 32a, the charge storage film 33a, the tunnel insulating film 34, the channel film 35, and the core insulating film 36 are sequentially formed in the memory hole 300. In a case of the memory film 30b according to the embodiment, the block insulating film 32 is not formed in the memory hole 300 at that time. Specifically, the charge storage film 33a is in contact with the oxide film 31.

Figure 15:
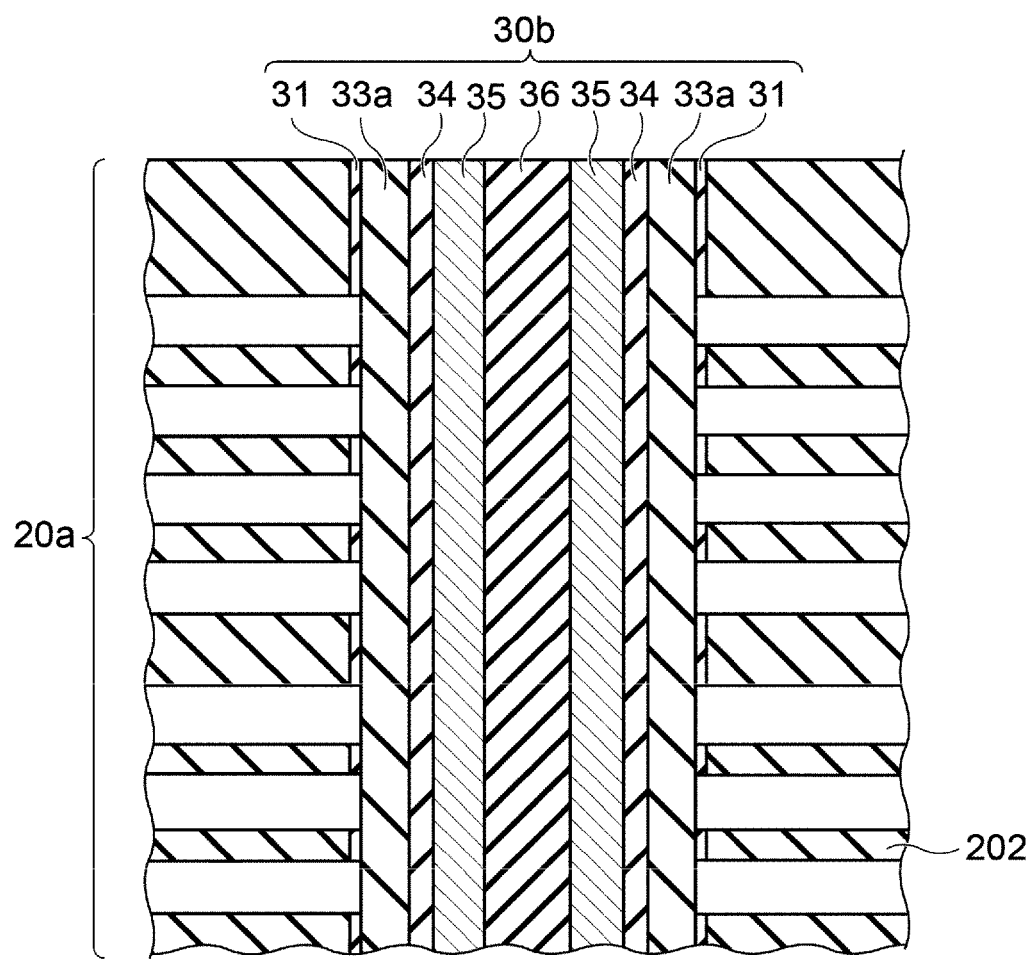
FIG. 15 is a cross-sectional view illustrating a step of removing an insulating layer according to the second embodiment.

Next, the insulating layers 201a and a part of the oxide film 31 in contact with each of the insulating layers 201a are removed as shown in FIG. 15. The insulating layers 201a and the oxide film 31 may be removed by the method described in the first embodiment.

Figure 16:
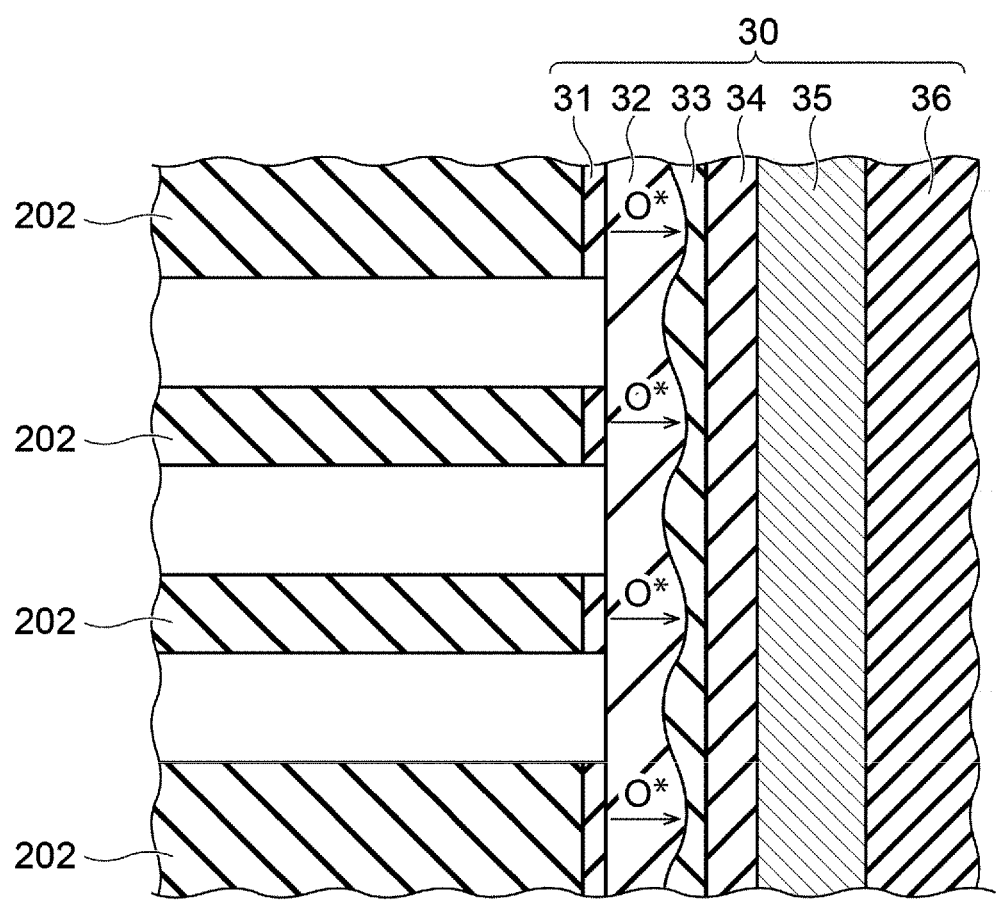
FIG. 16 is a cross-sectional view illustrating a step of performing an oxidation treatment according to the second embodiment.

Subsequently, an oxidation treatment is performed using WVG similarly to the first embodiment. By the oxidation treatment, radicals (O*) are generated in the oxide film 31 stacked in the insulating layers 202 as shown in FIG. 16. The radicals are isotropically diffused in the charge storage film 33a, to oxidize a part of the charge storage film 33a into the block insulating film 32.

Next, the block insulating layer 221 and the conductive layer 211 are formed at a location where each of the insulating layers 201a is removed, similarly to the first embodiment. As a result, the electrode layers 201 are completed. At that time, the thickness of the block insulating film 32 at a portion facing each of the insulating layers 202 is larger than the thickness of the block insulating film 32 at a portion facing each of the electrode layers 201, similarly to the first embodiment.

In this embodiment, even when the distance between the electrode layers 201 is decreased due to a decrease in the thickness of the insulating layers 202, the charge movement between the memory cells adjacent to each other in the Z direction can be reduced. Therefore, the charge retention property can be improved.

In this embodiment, the block insulating film 32 is formed by enhanced oxidation caused by the oxide film 31, and thus a step of forming the block insulating film 32 in the memory hole 300 is unnecessary. This makes it possible to shorten a production time.

In each of the embodiments described above, the thickness of the block insulating film 32 is adjusted by enhanced oxidation caused by the oxide film 31. However, a method for adjusting the thickness of the block insulating film 32 is not limited to the enhanced oxidation. Therefore, the oxide film 31 is unnecessary if the thickness of the block insulating film 32 at the portion facing each of the insulating layers 202 can be made larger than the thickness thereof at the portion facing each of the electrode layers 201.

A semiconductor device and a method for manufacturing the semiconductor device described in WHAT IS CLAIMED IS may have configurations described in the following Notes.

Note 1

The semiconductor memory device according to claim 2, wherein the high-k material is hafnium oxide ($HfO_2$), aluminum oxide ($Al_2O_3$), titanium oxide ($TiO_2$), barium oxide (BaO), ruthenium oxide ($RuO_4$), lanthanum oxide ($La_2O_3$), zirconium oxide ($ZrO_2$), yttrium oxide ($Y_2O_3$), magnesium oxide (MgO), tantalum oxide ($Ta_2O_5$), strontium oxide (SrO), or niobium oxide ($Nb_2O_5$).

Note 2

The semiconductor memory device according to claim 2, wherein a border line between the block insulating film and the charge storage film is a rounded curve.

Note 3

The semiconductor memory device according to claim 2, wherein the high-k material is aluminum oxynitride (AlON), hafnium oxynitride (HfON), titanium oxynitride (TiON), or zirconium oxynitride (ZrON).

Note 4

The semiconductor memory device according to claim 2, wherein the high-k material is a first mixture obtained by adding aluminum, iodine, or lanthanum to a first metal oxide such as titanium oxide, hafnium oxide, or zirconium oxide or a second mixture obtained by adding titanium, hafnium, or zirconium to a second metal oxide such as tantalum oxide or niobium oxide.

Note 5

The semiconductor memory device according to claim 2, wherein the block insulating film is a silicon oxide film, and the charge storage film is a silicon nitride film.

Note 6

The method for manufacturing the semiconductor memory device according to claim 5, wherein radicals generated in the oxide film by the oxidation treatment are diffused in the charge storage film, to form the block insulating film.

Note 7

The method for manufacturing the semiconductor memory device according to claim 5, wherein the oxide film is formed from a high-k material.

Note 8

The method for manufacturing the semiconductor memory device according to claim 5, wherein the oxide film has a thickness of 4 nm or less.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
   a stacked body including a plurality of electrode layers and a plurality of insulating layers, the electrode layers and the insulating layers being alternately stacked; and
   a memory film extending in a stacking direction in the stacked body, wherein
   the memory film includes an oxide film facing the insulating layers in a first direction intersecting the stacking direction, a block insulating film facing the electrode layers and the oxide film, and a charge storage film facing the block insulating film,
   the block insulating film has a larger thickness at a portion facing each of the insulating layers than a thickness at a portion facing each of the electrode layers, and
   the charge storage film has a smaller thickness at a portion facing each of the insulating layers than a thickness at a portion facing each of the electrode layers.

2. The semiconductor memory device according to claim 1, wherein the oxide film contains a high-k material.

3. The semiconductor memory device according to claim 1, wherein the oxide film has a thickness of 4 nm or less.

4. The semiconductor memory device according to claim 1, wherein a thickness of the block insulating film varies periodically in the stacking direction.

5. The semiconductor memory device according to claim 1, wherein a thickness of the charge storage film varies periodically in the stacking direction.

6. The semiconductor memory device according to claim 1, wherein
a thickness of the block insulating film changes periodically in the stacking direction,
a thickness of the charge storage film changes periodically in the stacking direction, and
the periodic change in the thickness of the block insulating film in the stacking direction is opposite to the periodic change in the thickness of the charge storage film in the stacking direction.

7. The semiconductor memory device according to claim 1, wherein
the block insulating film includes a protrusion that protrudes in the first direction intersecting the stacking direction, and a recess that concaves in the first direction.

8. The semiconductor memory device according to claim 7, wherein the protrusion and the recess of the block insulating film are alternately formed in the stacking direction.

9. The semiconductor memory device according to claim 7, wherein
a recess of the charge storage film faces the protrusion of the block insulating film, and a protrusion of the charge storage film faces the recess of the block insulating film.

10. A semiconductor memory device comprising:
a stacked body including a plurality of electrode layers and a plurality of insulating layers, the electrode layers and the insulating layers being alternately stacked; and
a memory film extending in a stacking direction in the stacked body, wherein
the memory film includes an oxide film facing the insulating layers in a first direction intersecting the stacking direction, a block insulating film facing the insulating layers and the electrode layers, and a charge storage film facing the block insulating film,
the block insulating film has a larger thickness at a portion facing each of the insulating layers than a thickness at a portion facing each of the electrode layers, and
the charge storage film has a smaller thickness at a portion facing each of the insulating layers than a thickness at a portion facing each of the electrode layers.

11. The semiconductor memory device according to claim 10, wherein the oxide film contains a high-k material.

12. The semiconductor memory device according to claim 11, wherein the oxide film has a thickness of 4 nm or less.

13. The semiconductor memory device according to claim 10, wherein a thickness of the block insulating film varies periodically in the stacking direction.

14. The semiconductor memory device according to claim 10, wherein a thickness of the charge storage film varies periodically in the stacking direction.

15. The semiconductor memory device according to claim 10, wherein
a thickness of the block insulating film changes periodically in the stacking direction,
a thickness of the charge storage film changes periodically in the stacking direction, and
the periodic change in the thickness of the block insulating film in the stacking direction is opposite to the periodic change in the thickness of the charge storage film in the stacking direction.

16. The semiconductor memory device according to claim 10, wherein
the block insulating film includes a protrusion that protrudes in the first direction intersecting the stacking direction, and a recess that concaves in the first direction.

17. The semiconductor memory device according to claim 16, wherein the protrusion and the recess of the block insulating film are alternately formed in the stacking direction.

18. The semiconductor memory device according to claim 16, wherein
a recess of the charge storage film faces the protrusion of the block insulating film, and a protrusion of the charge storage film faces the recess of the block insulating film.

* * * * *